US012785721B2

(12) United States Patent
Ayyapureddi

(10) Patent No.: US 12,785,721 B2
(45) Date of Patent: Nov. 3, 2026

(54) APPARATUSES AND METHODS FOR SCALABLE 1-PASS ERROR CORRECTION CODE OPERATIONS

(71) Applicant: MICRON TECHNOLOGY, INC., Boise, ID (US)

(72) Inventor: Sujeet Ayyapureddi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/747,696

(22) Filed: Jun. 19, 2024

(65) Prior Publication Data

US 2025/0112643 A1 Apr. 3, 2025

Related U.S. Application Data

(60) Provisional application No. 63/587,627, filed on Oct. 3, 2023.

(51) Int. Cl.
*H03M 13/11* (2006.01)
*H03M 13/00* (2006.01)

(52) U.S. Cl.
CPC ...... *H03M 13/1111* (2013.01); *H03M 13/611* (2013.01)

(58) Field of Classification Search
CPC ............ H03M 13/1111; H03M 13/611; H03M 13/35; H03M 13/13; H03M 13/19; H03M 13/3707; G06F 11/1048
See application file for complete search history.

(56) References Cited

U.S. PATENT DOCUMENTS 5,177,705 A 1/1993 Mcelroy et al.
5,299,164 A 3/1994 Takeuchi et al.
5,333,274 A 7/1994 Amini et al.
5,434,814 A 7/1995 Cho et al.
6,249,476 B1 6/2001 Yamazaki et al.
7,117,421 B1 10/2006 Danilak
(Continued)

FOREIGN PATENT DOCUMENTS

WO 2016048634 A1 3/2016
WO 2024107367 A1 5/2024
(Continued)

OTHER PUBLICATIONS

U.S. Appl. No. 18/745,877 titled “Apparatuses and Methods for Half-Page Modes of Memory Devices” filed Jun. 17, 2024, pp. all pages of the application as filed.
(Continued)

*Primary Examiner* — Thien Nguyen
(74) *Attorney, Agent, or Firm* — Dorsey & Whitney LLP

(57) ABSTRACT

Apparatuses, systems, and methods for scalable 1-pass error correction code operations. A memory device includes an error correction code (ECC) circuit which generates a number of parity bits based on a plurality of data bits during a write operation. The number of parity bits may be selected based on a setting in a mode register. The data and parity are written to the memory array as part of a single access pass. The data may be written to a selected portion of the data column planes, while the parity is written to one or more column planes of the extra column plane or a non-selected portion of the data column planes.

19 Claims, 5 Drawing Sheets

(56) References Cited

U.S. PATENT DOCUMENTS 8,891,313 B2 11/2014 Chang et al.
9,158,617 B2 10/2015 Cho et al.
9,195,537 B2 11/2015 Sharon et al.
9,201,728 B2 12/2015 Patapoutian et al.
9,361,960 B2 6/2016 Vogelsang
9,547,550 B1 1/2017 Thakore et al.
9,607,679 B1 3/2017 Kim et al.
9,666,291 B2 5/2017 Park
9,880,901 B2 1/2018 Zastrow
9,996,799 B2 6/2018 Bostick et al.
10,127,101 B2 11/2018 Halbert et al.
10,222,989 B1 3/2019 Zitlaw
10,243,590 B1 3/2019 Seshadri
10,810,079 B2 10/2020 Halbert et al.
10,817,371 B2 10/2020 Rooney et al.
10,872,011 B2 12/2020 Bains et al.
10,929,033 B2 2/2021 Meeker et al.
10,937,517 B1 3/2021 Rich-Plotkin et al.
10,963,336 B2 3/2021 Veches
11,010,304 B2 5/2021 Kang et al.
11,074,126 B2 7/2021 Prather et al.
11,088,710 B2 8/2021 Lee et al.
11,177,012 B1 11/2021 Avraham et al.
11,200,961 B1 12/2021 Uribe
11,264,085 B1 3/2022 Ware et al.
11,538,515 B2 12/2022 Ji et al.
11,579,971 B2 2/2023 Ayyapureddi
11,580,038 B2 2/2023 Norman et al.
11,615,861 B2 3/2023 Kim et al.
11,728,003 B2 8/2023 Suh et al.
11,830,570 B2 11/2023 Laurent et al.
11,837,316 B1 12/2023 Smith et al.
12,001,707 B2 6/2024 Boehm et al.
12,014,797 B2 6/2024 Ayyapureddi
12,019,513 B2 6/2024 Ayyapureddi
12,095,474 B1 9/2024 Zhu et al.
12,204,410 B2 1/2025 Sutera et al.
12,204,770 B2 1/2025 Ayyapureddi
12,230,347 B2 2/2025 Suh et al.
12,249,393 B2 3/2025 Reohr
12,299,291 B2 5/2025 Eilert et al.
12,475,965 B2 11/2025 Smith et al.
12,488,853 B2 12/2025 Smith et al.
12,511,191 B2 12/2025 Ayyapureddi et al.
12,512,176 B2 12/2025 Smith et al.
12,524,298 B2 1/2026 Ayyapureddi
12,524,306 B2 1/2026 Ayyapureddi
12,530,261 B2 1/2026 Ayyapureddi et al.
12,536,096 B2 1/2026 Ayyapureddi
12,541,425 B2 2/2026 Ayyapureddi et al.
12,541,429 B2 2/2026 Ayyapureddi
12,579,026 B2 3/2026 Ayyapureddi
2003/0081492 A1 5/2003 Farrell et al.
2003/0117838 A1 6/2003 Hidaka
2005/0226070 A1 10/2005 Ohsawa
2006/0233030 A1 10/2006 Choi
2008/0089129 A1 4/2008 Lee
2008/0313493 A1 12/2008 Roohparvar et al.
2009/0097348 A1 4/2009 Minzoni et al.
2009/0132876 A1 5/2009 Freking et al.
2009/0168523 A1 7/2009 Shirakawa et al.
2009/0196103 A1 8/2009 Kim et al.
2010/0177582 A1 7/2010 Kim et al.
2010/0177587 A1 7/2010 Huang
2010/0290146 A1 * 11/2010 Lam .................. G11B 27/3027
360/39
2011/0154158 A1 6/2011 Yurzola et al.
2012/0092940 A1 4/2012 Chang et al.
2013/0117630 A1 5/2013 Kang
2013/0275709 A1 10/2013 Gajapathy
2014/0126300 A1 5/2014 Takahashi et al.
2015/0193464 A1 7/2015 Kwon et al.
2015/0262631 A1 9/2015 Shimizu
2016/0070507 A1 3/2016 Hoshikawa et al.
2016/0092307 A1 3/2016 Bonen et al.
2016/0125920 A1 5/2016 Kim et al.
2016/0307645 A1 10/2016 Kim et al.
2016/0365131 A1 12/2016 Kim et al.
2017/0060681 A1 3/2017 Halbert et al.
2017/0062067 A1 3/2017 Yang et al.
2017/0091025 A1 3/2017 Ahn et al.
2017/0192843 A1 7/2017 Warnes et al.
2017/0249097 A1 8/2017 Eguchi
2017/0269992 A1 9/2017 Bandic et al.
2017/0285990 A1 10/2017 Chen et al.
2017/0286213 A1 10/2017 Li
2017/0344423 A1 11/2017 Hsiao et al.
2018/0025760 A1 1/2018 Mazumder et al.
2018/0121283 A1 5/2018 Plants
2018/0150350 A1 5/2018 Cha et al.
2018/0301203 A1 10/2018 Kim
2019/0066816 A1 2/2019 Dono
2019/0073261 A1 3/2019 Halbert et al.
2019/0103154 A1 4/2019 Cox et al.
2019/0197171 A1 6/2019 Tiwari et al.
2019/0206478 A1 7/2019 Jun
2019/0362792 A1 11/2019 Oh et al.
2019/0369893 A1 12/2019 Ross
2019/0371403 A1 12/2019 Maejima
2020/0019462 A1 1/2020 Prather et al.
2020/0051616 A1 2/2020 Cho
2020/0104205 A1 4/2020 Noguchi et al.
2020/0104208 A1 4/2020 Heo et al.
2020/0194050 A1 6/2020 Akamatsu
2020/0226039 A1 7/2020 Lee
2020/0321060 A1 10/2020 Lang et al.
2020/0373941 A1 11/2020 Latorre et al.
2021/0011645 A1 1/2021 Martinelli et al.
2021/0012817 A1 1/2021 Laurent et al.
2021/0012849 A1 1/2021 Kim et al.
2021/0057003 A1 2/2021 Prather et al.
2021/0064119 A1 3/2021 Mirichigni et al.
2021/0064282 A1 3/2021 He et al.
2021/0064461 A1 3/2021 Veches
2021/0064467 A1 3/2021 Buerkle et al.
2021/0083687 A1 3/2021 Lee et al.
2021/0142848 A1 5/2021 Lim et al.
2021/0142860 A1 5/2021 Song et al.
2021/0200630 A1 7/2021 Ishikawa et al.
2021/0208967 A1 7/2021 Cha et al.
2021/0224155 A1 7/2021 Bains et al.
2021/0247910 A1 8/2021 Kim et al.
2021/0272627 A1 9/2021 Lee
2021/0294692 A1 9/2021 Chen
2021/0311821 A1 * 10/2021 Ryu .................... H01L 25/0657
2021/0311822 A1 10/2021 Jannusch et al.
2021/0311830 A1 10/2021 Lee
2021/0357287 A1 11/2021 Kim et al.
2021/0358559 A1 11/2021 Suh et al.
2021/0365316 A1 11/2021 Nale et al.
2021/0406123 A1 12/2021 Nakanishi et al.
2022/0027090 A1 1/2022 Kwon et al.
2022/0035529 A1 * 2/2022 Bennett .............. G11B 20/1803
2022/0084565 A1 3/2022 Prather et al.
2022/0091938 A1 3/2022 Buerkle et al.
2022/0129196 A1 4/2022 Roberts et al.
2022/0138065 A1 5/2022 Secatch et al.
2022/0197739 A1 6/2022 Ryu et al.
2022/0261310 A1 8/2022 Ishikawa et al.
2022/0334917 A1 10/2022 Veches
2022/0337271 A1 10/2022 Hanna
2022/0365692 A1 * 11/2022 Vankamamidi ....... G06F 3/0689
2022/0398042 A1 12/2022 Song et al.
2022/0415398 A1 12/2022 Lien et al.
2023/0009642 A1 1/2023 Eilert et al.
2023/0146549 A1 5/2023 Lien et al.
2023/0161665 A1 5/2023 Choi et al.
2023/0185665 A1 6/2023 Ayyapureddi
2023/0223096 A1 7/2023 Bains et al.
2023/0236747 A1 7/2023 Curewitz et al.
2023/0289072 A1 9/2023 Cho et al.
2023/0298682 A1 9/2023 Suh et al.
2023/0315571 A1 10/2023 Sutera et al.
2023/0350581 A1 11/2023 Ayyapureddi

(56) References Cited

U.S. PATENT DOCUMENTS

| | | | |
|---|---|---|---|
| 2023/0350748 | A1 | 11/2023 | Ayyapureddi |
| 2023/0352064 | A1 | 11/2023 | Ayyapureddi |
| 2023/0352112 | A1 | 11/2023 | Ayyapureddi |
| 2024/0004754 | A1 | 1/2024 | Veches |
| 2024/0029781 | A1 | 1/2024 | Schreck et al. |
| 2024/0079074 | A1 | 3/2024 | Bak et al. |
| 2024/0086520 | A1 | 3/2024 | Kaplan et al. |
| 2024/0096404 | A1 | 3/2024 | Cho et al. |
| 2024/0126438 | A1 | 4/2024 | Suh et al. |
| 2024/0160351 | A1 | 5/2024 | Ayyapureddi et al. |
| 2024/0160524 | A1 | 5/2024 | Ayyapureddi et al. |
| 2024/0160527 | A1 | 5/2024 | Ayyapureddi et al. |
| 2024/0161855 | A1 | 5/2024 | Smith et al. |
| 2024/0161856 | A1 | 5/2024 | Smith et al. |
| 2024/0161859 | A1 | 5/2024 | Ayyapureddi et al. |
| 2024/0170088 | A1 | 5/2024 | Smith et al. |
| 2024/0176699 | A1 | 5/2024 | Ayyapureddi et al. |
| 2024/0177794 | A1 | 5/2024 | Vogelsang |
| 2024/0220142 | A1 | 7/2024 | Park |
| 2024/0220149 | A1 | 7/2024 | Kim et al. |
| 2024/0248796 | A1 | 7/2024 | Ayyapureddi |
| 2024/0256380 | A1 | 8/2024 | Ayyapureddi |
| 2024/0256382 | A1 | 8/2024 | Ayyapureddi |
| 2024/0272979 | A1 | 8/2024 | Ayyapureddi |
| 2024/0272984 | A1 | 8/2024 | Ayyapureddi |
| 2024/0273014 | A1 | 8/2024 | Ayyapureddi |
| 2024/0274223 | A1 | 8/2024 | Ayyapureddi |
| 2024/0281327 | A1 | 8/2024 | Ayyapureddi et al. |
| 2024/0289266 | A1 | 8/2024 | Ayyapureddi |
| 2024/0321328 | A1 | 9/2024 | Ayyapureddi |
| 2024/0377952 | A1 | 11/2024 | Song et al. |
| 2024/0394178 | A1 | 11/2024 | Partsch |
| 2024/0419538 | A1 | 12/2024 | Huang et al. |
| 2025/0077103 | A1 | 3/2025 | Ayyapureddi |
| 2025/0077424 | A1 | 3/2025 | Ayyapureddi |
| 2025/0078906 | A1 | 3/2025 | Kim et al. |
| 2025/0078949 | A1 | 3/2025 | Ayyapureddi |
| 2025/0078950 | A1 | 3/2025 | Ayyapureddi |
| 2025/0110643 | A1 | 4/2025 | Ayyapureddi |
| 2025/0110825 | A1 | 4/2025 | Ayyapureddi |
| 2025/0110830 | A1 | 4/2025 | Ayyapureddi |
| 2025/0111887 | A1 | 4/2025 | Ayyapureddi |
| 2025/0123924 | A1 | 4/2025 | Ayyapureddi et al. |
| 2025/0138940 | A1 | 5/2025 | Cho et al. |
| 2025/0156087 | A1 | 5/2025 | Ayyapureddi |
| 2025/0165160 | A1 | 5/2025 | Eilert et al. |
| 2026/0044413 | A1 | 2/2026 | Ayyapureddi et al. |
| 2026/0051358 | A1 | 2/2026 | Smith et al. |
| 2026/0057955 | A1 | 2/2026 | Smith et al. |

FOREIGN PATENT DOCUMENTS

| | | | |
|---|---|---|---|
| WO | 2024107503 | A1 | 5/2024 |
| WO | 2024107504 | A1 | 5/2024 |
| WO | 2024167711 | A1 | 8/2024 |
| WO | 2025053912 | A1 | 3/2025 |
| WO | 2025075696 | A1 | 4/2025 |
| WO | 2025075697 | A1 | 4/2025 |

OTHER PUBLICATIONS

U.S. Appl. No. 18/745,894 titled "Apparatuses and Methods for Half-Page Modes of Memory Devices" filed Jun. 17, 2024, pp. all pages of the application as filed.

U.S. Appl. No. 18/747,658, titled "Apparatuses and Methods for Bounded Fault Compliant Metadata Storage" filed Jun. 19, 2024, pp. all pages of application as filed.

U.S. Appl. No. 18/747,676, titled "Apparatuses and Methods for Alternate Memory Die Metadata Storage", filed Jun. 19, 2024, pp. all pages of application as filed.

U.S. Appl. No. 18/747,712, titled "Apparatuses and Methods for Granular Single-Pass Metadata Access Operations" filed Jun. 19, 2024, pp. all pages of application as filed.

U.S. Appl. No. 18/747,635, titled "Apparatuses and Methods for Read/Modify/Write Single-Pass Metadata Access Operations" filed Jun. 19, 2024, pp. all pages of application as filed.

PCT Application No. PCT/US24/39192 titled "Apparatuses and Methods for Scalable 1-Pass Error Correction Code Operations" filed Jul. 23, 2024, pp. all pages of the application as filed.

PCT Application No. PCT/US24/39195 titled "Apparatuses and Methods for Half-Page Modes of Memory Devices" filed Jul. 23, 2024, pp. all pages of the application as filed.

PCT Application No. PCT/US24/39231 titled "Apparatuses and Methods for Granular Single-Pass Metadata Access Operations" filed Jul. 24, 2024, pp. all pages of the application as filed.

International Search Report and Written Opinion for PCT/US2024/039192, mailed on Nov. 4, 2024; pgs. all.

U.S. Appl. No. 17/730,381, titled "Apparatuses, Systems, and Methods for Per Row Error Scrub Information", filed Apr. 27, 2022; pp. all pages of application as filed.

U.S. Appl. No. 17/730,396, titled "Apparatuses, Systems, and Methods for Per Row Error Scrub Information Registers", filed Apr. 27, 2022; pp. all pages of application as filed.

U.S. Appl. No. 17/731,024, titled "Apparatuses, Systems, and Methods for Managing Metadata Storage at a Memory", filed Apr. 27, 2022; pp. all pages of the application as filed.

U.S. Appl. No. 18/424,282 titled "Apparatuses and Methods for Bounded Fault Compliant Metadata Storage" filed Jan. 26, 2024; pp. all pages of application as filed.

U.S. Appl. No. 18/424,342 titled "Apparatuses and Methods for Bounded Fault Compliant Metadata Storage" filed Jan. 26, 2024; pp. all pages of application as filed.

U.S. Appl. No. 18/430,381, titled "Apparatuses, Systems, and Methods for Storing Memory Metadata", filed Feb. 1, 2024; pp. all pages of application as filed.

U.S. Appl. No. 18/430,406, titled "Apparatuses, Systems, and Methods for Storing Memory Metadata", filed Feb. 1, 2024; pp. all pages of application as filed.

U.S. Appl. No. 18/431,232, titled "Apparatuses, Systems, and Methods for Storing Memory Metadata", filed Feb. 2, 2024; pp. all pages of application as filed.

U.S. Appl. No. 18/431,306, titled "Apparatuses, Systems, and Methods for Storing Memory Metadata", filed Feb. 2, 2024; pp. all pages of application as filed.

U.S. Appl. No. 18/441,775 titled "Apparatuses and Methods for Settings for Adjustable Write Timing" filed Feb. 14, 2024, pp. all pages of the application as filed.

U.S. Appl. No. 18/441,830 titled "Apparatuses, Systems, and Methods for Storing and Accessing Memory Metadata and Error Correction Code Data" filed Feb. 14, 2024, pp. all pages of the application as filed.

U.S. Appl. No. 18/504,215 titled "Apparatuses and Methods for Enhanced Metadata Support" filed Nov. 8, 2023; pp. all pages of application as filed.

U.S. Appl. No. 18/504,234 titled "Apparatuses and Methods for Enhanced Metadata Support" filed Nov. 8, 2023; pp. all pages of application as filed.

U.S. Appl. No. 18/504,302 titled "Apparatuses and Methods for Configurable ECC Modes" filed Nov. 8, 2023; pp. all pages of application as filed.

U.S. Appl. No. 18/504,316 titled "Apparatuses and Methods for Configurable ECC Modes" filed Nov. 8, 2023; all pages of application as filed.

U.S. Appl. No. 18/504,324 titled "Apparatuses and Methods for Single-Pass Access of ECC Information, Metadata Information or Combinations Thereof" filed Nov. 8, 2023, all pages of application as filed.

U.S. Appl. No. 18/504,342 titled "Apparatuses and Methods for Single-Pass Access of ECC Information, Metadata Information or Combinations Thereof" filed Nov. 8, 2023; pp. all pages of application as filed.

U.S. Appl. No. 18/504,353 titled "Apparatuses and Methods for Separate Write Enable for Single-Pass Accessof Data, Metadata, and Parity Information" filed Nov. 8, 2023; pp. all pages of application as filed.

(56) References Cited

OTHER PUBLICATIONS

U.S. Appl. No. 18/504,362 titled "Apparatuses and Methods for Separate Write Enable for Single-Pass Access of Data, Metadata, and Parity Information" filed Nov. 8, 2023; pp. all pages of application as filed.
U.S. Appl. No. 18/625,539, titled "Apparatuses, Systems, and Methods for Per Row Error Scrub Information" filed Apr. 3, 2024, pp. all pages of application as filed.
U.S. Appl. No. 18/734,189, titled "Apparatuses, Systems, and Methods for Managing Metadata Storage at a Memory" filed Jun. 5, 2024, pp. all pages of application as filed.
U.S. Appl. No. 18/743,994 titled "Apparatuses and Methods for Shared Codeword in 2-Pass Access Operations" filed Jun. 14, 2024, pp. all pages of the application as filed.
U.S. Appl. No. 18/745,577 titled "Apparatuses and Methods for Half-Page Modes of Memory Devices" filed Jun. 17, 2024, pp. all pages of the application as filed.
U.S. Appl. No. 18/745,843 titled "Apparatuses and Methods for Half-Page Modes of Memory Devices" filed Jun. 17, 2024, pp. all pages of the application as filed.
U.S. Appl. No. 17/730,992 titled "Apparatuses, Systems, and Methods for Managing Metadata Security and Access" filed Apr. 27, 2022, pp. all pages of application as filed.
Lumenci Team "High Bandwidth Memory (HBM3)" https://lumenci.com/blogs/high-bandwidth-memory; Editorial Team at Lumenci, Jul. 14, 2022; pp. 1-3.
Chen et al., "CATCAM: Constant-time Alteration Ternary CAM with Scalable In-Memory Architecture"; 2020 53rd Annual IEEE/ACM International Symposium on Microarchitecture (MICRO), Athens, Green; Oct. 17-21, 2020; pp. 342-355.
J. F. Philippe Marchand "An Alterable Programmable Logic Array"; IEEE Journal of Solid-State Circuits, vol. sc-20, No. 5, Oct. 1985; pp. 1061-1066.
U.S. Appl. No. 19/025,934, titled "Apparatuses, Systems, and Methods for Managing Metadata Security and Access" filed Jan. 16, 2025, pp. all pages of application as filed.
U.S. Appl. No. 19/360,159 titled "Apparatuses and Methods for Enhanced Metadata Support" filed Oct. 16, 2025; pp. all pages of the application as filed.
U.S. Appl. No. 19/366,908 titled "Apparatuses and Methods for Configurable ECC Modes", filed Oct. 23, 2025; pp. all pages of application as filed.
U.S. Appl. No. 19/376,027 titled "Apparatuses and Methods for Single-Pass Access of ECC Information, Metadata Information or Combinations Thereof", filed Oct. 31, 2025; pp. all pages of application as filed.
U.S. Appl. No. 19/381,448 titled "Apparatuses and Methods for Enhanced Metadata Support", filed Nov. 6, 2025; pp. all pages of application as filed.
U.S. Appl. No. 19/431,541, titled "Apparatuses And Methods For Bounded Fault Compliant Metadata Storage" filed Dec. 23, 2025, pp. all pages of application as filed.
U.S. Appl. No. 19/435,124 titled "Apparatuses, Systems, and Methods for Storing Memory Metadata", filed Dec. 29, 2025; pp. all page of the application as filed.
U.S. Appl. No. 19/441,648, titled "Apparatuses, Systems, and Methods for Storing and Accessing Memory Metadata and Error Correction Code Data" filed Jan. 6, 2026; pp. all pages of application as filed.
Handy, Jim, "Emerging Memories Today: Understanding Bit Selectors", The Memory Guy Blog, Objective Analysis on Semiconductor Memories, Nov. 2018, 5 pgs.
U.S. Appl. No. 19/543,150, titled "Apparatuses, Systems, and Methods for Storing Memory Metadata", filed Feb. 18, 2026, pp. all pages of application as filed.
U.S. Appl. No. 19/723,238, titled "Apparatuses and Methods for Separate Write Enable for Single-Pass Access of Data, Metadata, and Parity Information", filed Jun. 29, 2026, pp. all pages of application as filed.
U.S. Appl. No. 19/725,351, titled "Apparatuses and Methods for Configurable ECC Modes", filed Jun. 30, 2026, pp. all pages of application as filed.
U.S. Appl. No. 19/731,515, titled "Apparatuses, Systems, and Methods for Storing Memory Metadata", filed Jul. 6, 2026, pp. all pages of application as filed.
U.S. Appl. No. 19/744,005, titled "Apparatuses, Systems, and Methods for Storing Memory Metadata", filed Jul. 16, 2026, pp. all pages of application as filed.

* cited by examiner

APPARATUSES AND METHODS FOR SCALABLE 1-PASS ERROR CORRECTION CODE OPERATIONS

CROSS REFERENCE TO RELATED APPLICATION(S)

This application claims the benefit under 35 U.S.C. § 119 of the earlier filing date of U.S. Provisional Application Ser. No. 63/587,627 filed Oct. 3, 2023 the entire contents of which is hereby incorporated by reference in its entirety for any purpose.

BACKGROUND

This disclosure relates generally to semiconductor devices, and more specifically to semiconductor memory devices. In particular, the disclosure relates to volatile memory, such as dynamic random access memory (DRAM). Information may be stored on individual memory cells of the memory as a physical signal (e.g., a charge on a capacitive element). During an access operation, an access command may be received along with address information which specifies which memory cells should be accessed.

There is a growing interest in enabling the memory to correct the information stored therein. Memories may include an error correction code (ECC) circuit which is used to determine if there are errors in the accessed information (and may correct one or more of the errors). There may be a need to increase the flexibility of the ECC circuit.

DETAILED DESCRIPTION

Figure 1:
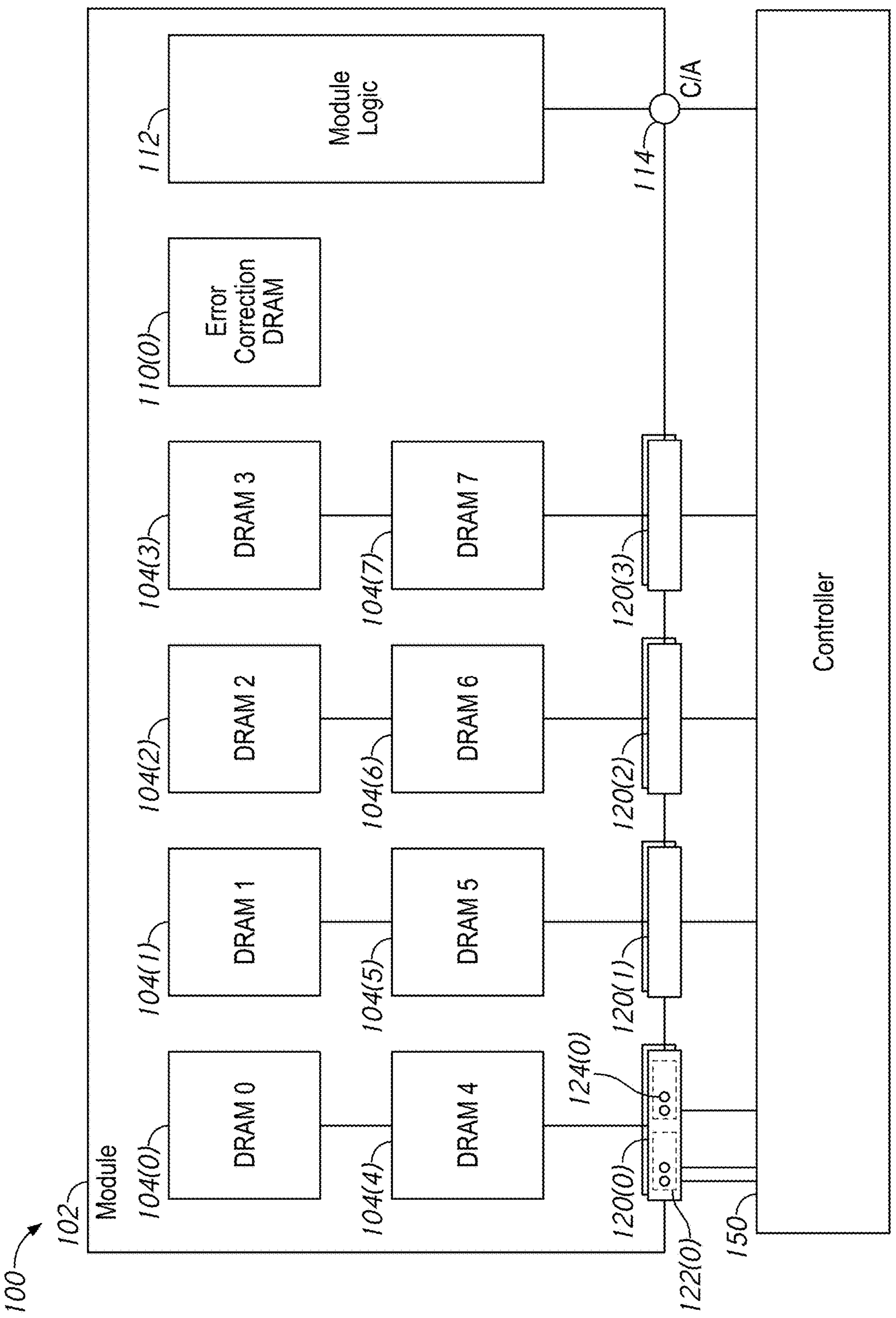
FIG. 1 is a block diagram of a memory system according to some embodiments of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Memory arrays may generally include a number of memory cells arranged at the intersection of word lines (rows) and bit lines/digit lines (columns). The columns may be grouped together into column planes, and a column select (CS) signal may be used to select a set of columns within each of the active column planes to provide data. When an access command such as a read or a write is received, one or more column planes may be activated and the a data codeword may be read from or written to the memory cells at the intersection of an active word line specified by a row address, and the bit lines in the active column planes specified by the CS signal (e.g., which is based on a column address). Some memory's may operate in a mode where fewer than all of the column planes are activated in a given access operation (e.g., and the data codeword is smaller). For example, a column plane select bit of the column address may specify a first portion (e.g., a first half) or a second portion (e.g., a second half) of the column planes.

Memory devices include error correction circuits, such as error correction code (ECC) circuits, which are used to determine if there are errors in the data. During a write operation, the ECC circuit receives the data codeword and generates parity bits based on that data codeword. During a read operation, the ECC circuit receives the data codeword and the parity stored in the array and determines errors based on the data codeword and parity. The parity may be stored in an extra column plane set aside for parity storage, which may be fired along with the other data column planes.

In an example implementation, the ECC circuit may implement single error correction (SEC) where up to a single bit of error may be located and corrected, or single error correction, double error detection (SECDED) where up to a single error may be located, but up to two bits of error may be detected (without locating them to correct them). The amount of error bits which may be detected/corrected may depend, in part, on the number of data bits and the number of parity bits. Increasing the number of parity bits may generally increase ECC capability, however this may come at the cost of more space since the parity column plane may already fit a number of bits matched to the number of data codewords stored in the array. While space in the data column planes may be set aside for additional parity, in memory modes where all of the column planes are activated, it may be difficult to increase the number of parity bits without using multiple access passes to retrieve additional parity (e.g., since all of the column planes are already being used for normal data and parity access). There may be a need to increase the flexibility of error correction code operations to allow for ECC implementations to be chosen without increasing the number of access passes.

The present disclosure is drawn to apparatuses, systems, and methods for scalable 1-pass error correction code operations. In memory modes where less than all of the column planes are used for an access, the data codeword may be stored in the selected portion of the data column planes, while space for the parity may be set aside in one or more of the extra column plane and the non-selected data column planes. This may allow for an increased number of parity bits to be used for each codeword, which may in turn allow for increased ECC capability. This may allow for the data and parity to be accessed in a single access pass since even with the increased number of parity bits the total amount of accessed information is less than the maximum number that can be accessed in a single pass. This may also increase the flexibility of ECC operations, since mode register settings may increase the number of parity bits per codeword through remapping of where in the array the extra parity is stored and which and how many column planes are accessed.

In some embodiments, parity bits for a single data codeword may be stored in multiple ones of the non-selected column planes (which may include the extra column plane). For example, if each column select signal selects 8 bit lines in a column plane, but more than 8 bits of parity are desired, then the parity bits may be stored across multiple column planes.

In an example implementation, the memory array may include 16 column planes and an extra column plane. Each codeword includes 64 sets of bit lines (each associated with a respective value of the column select signal) and each set includes 8 bit lines activated by that value of the CS signal. Each data codeword includes 64 bits of data, and the ECC circuit is configured to generate 8 bits of parity for each data codeword. Accordingly, there may be more total parity bits than can fit in the extra column plane. To make room for this, space may be reserved in the data column planes such that for each codeword, the data is written in a selected half (e.g., 8) of the data column planes and the parity is either in a selected half of the sets of the bit lines in the extra column plane or in a non-selected data column plane.

A single access or single access pass may refer to an operation where the data and parity are retrieved together at approximately the same time. For example, the column decoder may provide column select signals to the column planes where the data and parity are stored simultaneously, and the data and parity may get accessed all at once. This may be useful because each access operation may invoke a delay time before the next access pass (e.g., tCCD). By retrieving information as part of a single pass, this delay time is not invoked between accessing the data and the parity, which may allow for decreased latency.

FIG. 1 is a block diagram of a memory system according to some embodiments of the present disclosure. The memory system 100 includes a memory module 102 and a controller 150 which operates the memory module 102. The module includes a number of memory devices 104 and 110. The memory devices 104 may be used to store data and may generally be referred to as data memory devices 104, while the memory device 110 is used to correct errors in data read from the data memory devices 104. The memory device 110 may be referred to as an error correction memory device 110. A module logic 112 receives commands and addresses over a command/address C/A bus from the controller 150 through a C/A terminal 114 and distributes those commands and addresses to the memory devices 104 and 110 over internal command and address buses (not shown). Data is communicated between the controller 150 and the module 102 along data buses which couple to data terminals (DQ) terminals 124 of the module 102. The data terminals 124 are organized into pseudo-channels 122 and channels 120. Each channel is a set of data terminals 124 associated with a memory device 104.

As an example, the present disclosure may generally be described with respect to a 9×2p2 memory module 102. In the 9×2p2 architecture, there are nine total memory devices 104 and 110. Eight data memory devices 104(0) to 104(7) and one error correction memory device 110. Each channel 120(0) to 120(7) includes one or more pseudo-channels 122, which may be operated independently of each other. In this embodiment, each channel 120 includes two pseudo-channels 122, each of which includes two data terminals 124. Since the memory devices and channels may generally be similar to each other, only a single device 104(0) and its associate channel 120(0) are described in detail herein. In order to simplify the layout of the figure, an arrangement of two rows of four devices 104 each is shown, and their associated channels 120 are shown as stacked boxes. However the representation of FIG. 1 does not necessarily represent the layout of a physical device. For example, a single row of 8 devices 104 may be used. Similarly, various buses and signal lines have been simplified down to a single line for clarity on the drawing, however, multiple physical signal lines may be represented by a single line in the drawing. Other module architectures may be used in other example embodiments.

During an example write operation, the controller 150 provides a write command and addresses (e.g., row, column, and/or bank addresses as explained in more detail herein) over the C/A terminal 114 to the module 102. The module logic 112 distributes the command and address to the data memory devices 104(0) to 104(7). The controller 150 also provides data to be written along the various DQ channels 120(0) to 120(7). Since the pseudo-channels 122 may be operated independently, we will consider a single pseudo-channel 122 and its two DQ terminals 124. Each data terminal receives a serial burst of bits, which together represent a codeword of data. For example, each terminal receives 32 data bits in series, for a total of 64 data bits. Each device 104 includes an ECC circuit, which generates parity bits based on the received 64 bits of data and stores the data and the parity in the array.

During an example read operation, the controller 150 provides a read command and addresses along the C/A terminal 114. The module logic 112 distributes these to the memory devices 104 to 110 and data is read out from the locations specified by the addresses. As part of the read operation, each memory device 104 may perform error correction based on the data and parity which is read out from the array. The corrected data is provided off the device to the controller. The parity may generally not be read out to the controller 150. In some embodiments, if the device's error correction detects a mistake then the device 104 may provide a signal to the controller 150 indicating a detected error.

The read and write operations may use a single-access pass to store both the data and parity. Each memory device may be capable of accessing up to 136 bits in a single access pass (e.g., generally 128 data bits and 8 parity bits). In the 9×2p2 architecture, 64 data bits plus a specified number of parity bits are used. Accordingly, the data plus parity may all be accessed as a single access pass. For example, as explained in more detail herein, the memory array may be split into two portions, each of which is associated with a value of a column plane select bit in the column address. Data may be stored in a selected one of the portions, while the parity may be stored in an extra column plane or in the non-selected portion.

During an example read operation, the error correction memory device 110 may be used to identify and correct errors in the data. The error correction memory device 110 may support correction of the data and metadata along one DQ terminal (e.g., the 34 or 36 bits provided along one of the terminals 124 in a pseudo-channel). The controller 150 may use information stored on the error correction memory device 110 to enable correction of the information after the information is received by the controller 150 during a read operation. For example, the error correction memory device 110 may store repair information (e.g., parity bits) which are associated with the data and metadata read out across all the data devices 104(0) to 104(7), and that parity may be used by a repair circuit (not shown) of the controller 150 to enable correction in the data and metadata of up to one of the DQ terminals. For example, if the data and metadata being provided along a first DQ terminal in a first pseudo-channel associated with memory 104(0) is corrupted, then the error correction device 110 enables the repair of that data and metadata. However, if the errors exist in bits across both DQ terminals in the pseudo-channel then correction may not be possible.

Figure 2:
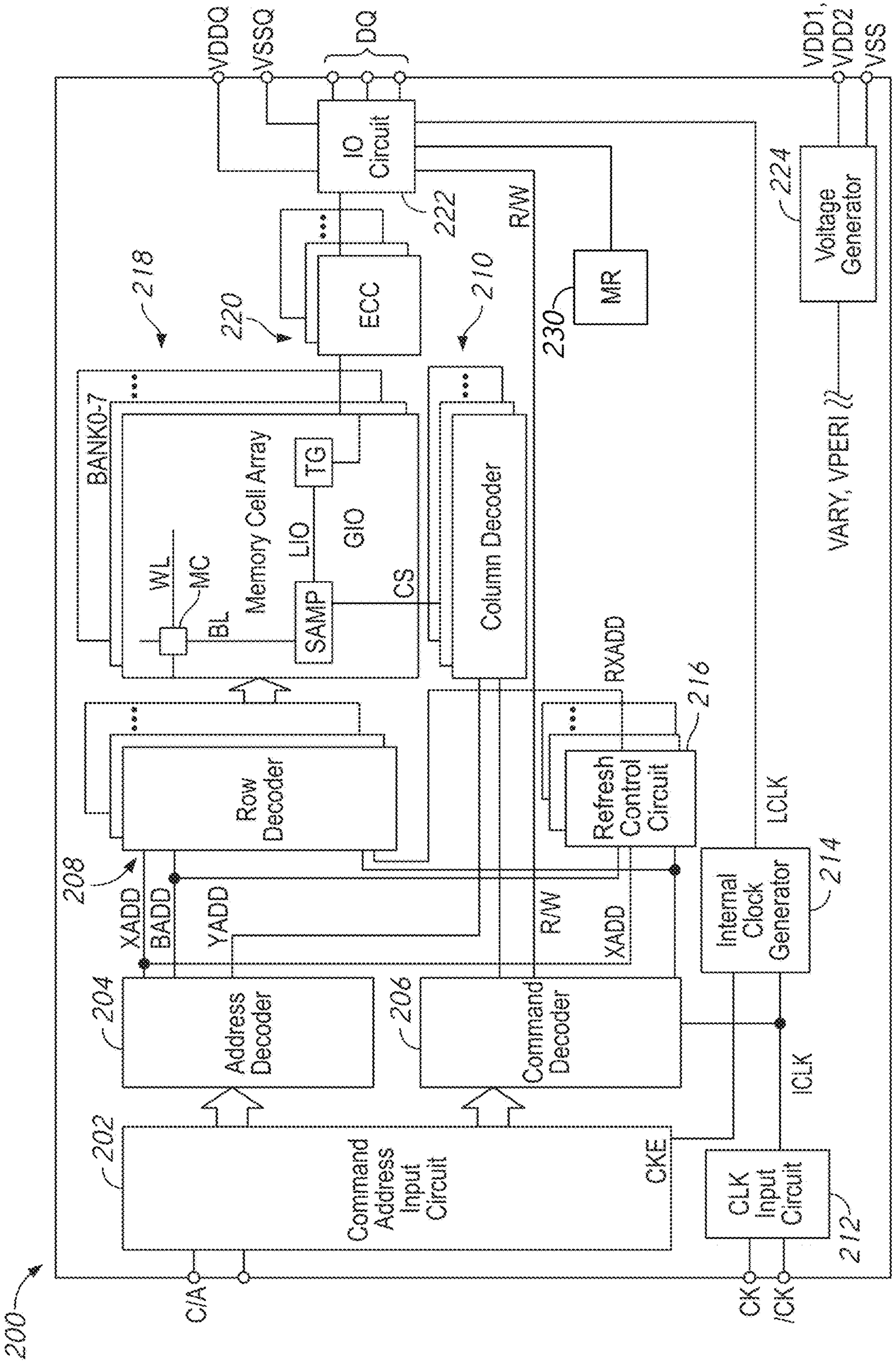
FIG. 2 is a block diagram of a semiconductor device according an embodiment of the disclosure.

FIG. 2 is a block diagram of a semiconductor device according an embodiment of the disclosure. The semiconductor device 200 may be a semiconductor memory device, such as a DRAM device integrated on a single semiconductor chip. In some embodiments of the present disclosure, the memory device 100 may be a standalone memory device. In some embodiments, the memory device 200 may be packaged together with other memory devices onto a module. For example, the device 200 may implement one of the devices 104 of the module 102 of FIG. 1.

The semiconductor device 200 includes a memory array 218. The memory array 218 is shown as including a plurality of memory banks. In the embodiment of FIG. 2, the memory array 218 is shown as including eight memory banks BANK0-BANK7. More or fewer banks may be included in the memory array 218 of other embodiments.

Each memory bank includes a plurality of word lines WL, a plurality of bit lines BL, and a plurality of memory cells MC arranged at intersections of the plurality of word lines WL and the plurality of bit lines BL. The selection of the word line WL is performed by a row decoder 108 and the selection of the bit lines BL is performed by a column decoder 210. In the embodiment of FIG. 2, the row decoder 208 includes a respective row decoder for each memory bank and the column decoder 210 includes a respective column decoder for each memory bank.

The bit lines BL are coupled to a respective sense amplifier (SAMP). Read data from the bit line BL is amplified by the sense amplifier SAMP, and transferred to an ECC circuit 220 over local data lines (LIO), transfer gate (TG), and global data lines (GIO). Conversely, write data outputted from the ECC circuit 220 is transferred to the sense amplifier SAMP over the complementary main data lines GIO, the transfer gate TG, and the complementary local data lines LIO, and written in the memory cell MC coupled to the bit line BL.

The semiconductor device 200 may employ a plurality of external terminals, such as solder pads, that include command and address (C/A) terminals coupled to a command and address bus to receive commands and addresses, clock terminals to receive clocks CK and/CK, data terminals DQ coupled to a data bus to provide data, and power supply terminals to receive power supply potentials VDD, VSS, VDDQ, and VSSQ. The external terminals may couple directly to the controller (e.g., 150 of FIG. 1) and/or may couple to various buses/connectors of the module (e.g., 102 of FIG. 1).

The clock terminals are supplied with external clocks CK and/CK that are provided to an input circuit 212. The external clocks may be complementary. The input circuit 212 generates an internal clock ICLK based on the CK and/CK clocks. The ICLK clock is provided to the command decoder 206 and to an internal clock generator 214. The internal clock generator 214 provides various internal clocks LCLK based on the ICLK clock. The LCLK clocks may be used for timing operation of various internal circuits. The internal data clocks LCLK are provided to the input/output circuit 222 to time operation of circuits included in the input/output circuit 222, for example, to data receivers to time the receipt of write data. The input/output circuit 222 may include a number of interface connections, each of which may be couplable to one of the DQ pads (e.g., the solder pads which may act as external connections to the device 200).

The C/A terminals may be supplied with memory addresses. The memory addresses supplied to the C/A terminals are transferred, via a command/address input circuit 202, to an address decoder 204. The address decoder 204 receives the address and supplies a decoded row address XADD to the row decoder 208 and supplies a decoded column address YADD to the column decoder 210. The decoded row address XADD may be used to determine which row should be opened, which may cause the data along the bit lines to be read out along the bit lines. The column decoder 210 may provide a column select signal CS, which may be used to determine which sense amplifiers provide data to the LIO. The address decoder 204 may also supply a decoded bank address BADD, which may indicate the bank of the memory array 218 containing the decoded row address XADD and column address YADD.

The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 202. The command decoder 206 includes circuits to decode the internal command signals to generate various internal signals and commands for performing operations. For example, the command decoder 206 may provide signals which indicate if data is to be read, written, etc.

The device 200 may receive an access command which is a write command. When the write command is received, and a bank address, a row address and a column address are timely supplied with the write command, write data supplied to the data terminals DQ by the controller is provided along the data bus and written to memory cells in the memory array 218 corresponding to the row address and column address. The write command is received by the command decoder 206, which provides internal commands so that the write data along the data bus and data terminals DQ is received by data receivers in the input/output circuit 222. The write data is supplied via the input/output circuit 222 to the ECC circuit 220. The ECC circuit generates parity bits based on the received data and the data and parity are provided to the memory array 218 to be written along a word line specified by the row address to memory cells specified by the column address. The column address may specify a portion of the memory array (e.g., a portion of the column planes) and the data may be written to the specified portion while the parity is written to the non-specified portion. The data and parity are written together as part of a single access pass.

The device 200 may receive an access command which is a read command. When a read command is received, and a bank address, a row address and a column address are timely supplied with the read command, read data and read parity is read from memory cells in the memory array 218 corresponding to the row address and column address. The read command is received by the command decoder 206, which provides internal commands so that read data and read parity from the memory array 218 is provided to the ECC circuit 220. The ECC circuit 220 receives detects and/or corrects errors in the data based on the parity. The correct read data is provided along the data bus, and the data is output to outside from the data terminals DQ via the input/output circuit 222. The data and parity may be read out as part of a single access pass.

The device 200 includes refresh control circuits 216 each associated with a bank of the memory array 218. Each refresh control circuit 216 may determine when to perform a refresh operation on the associated bank. The refresh control circuit 216 provides a refresh address RXADD (along with one or more refresh signals, not shown in FIG. 1). The row decoder 208 performs a refresh operation on one or more word lines associated with RXADD. The refresh control circuit 216 may perform multiple types of refresh operation, which may determine how the address RXADD is generated, as well as other details such as how many word lines are associated with the address RXADD.

The ECC circuit 220 may detect and/or correct errors in the accessed data. As part of a write operation, the ECC circuit 220 may receive bits from the IO circuit 222 and generate parity bits based on those received bits. The received bits and parity bits are written to the memory array 218. During an example read operation, the ECC circuit 220 receives a set of bits and their associated parity bits from the array 218 and uses them to locate and/or correct errors. The ECC circuit 220 may correct the information and then provide the corrected information (and/or a signal indicated detected errors) to the IO circuit 222. The parity bits may generally not be provided to the IO circuit 222.

The mode register 230 may include various settings. In some embodiments, the number of parity bits may be a setting of the mode register 230. Different levels of parity may be implemented by changing how much space in the array 218 is set aside for parity bits. For example, if the mode register 230 specifies 8 bits of parity per codeword, then a single column plane may be used for each codeword's parity. If the mode register specifies 10 bits of parity per codeword, then two column planes may be used for each codeword's parity. The setting in the mode register 230 which determines how many parity bits to use may be received by the column decoder 210 which may change the mapping of CS values which are provided responsive to a column address.

The ECC circuit 220 may also receive the setting and may adjust to account for increased (or decreased) levels of parity. In some embodiments, the device 200 may include multiple ECC engines which may be selected for different ECC modes and different numbers of parity. Based on the mode register setting 230, the ECC circuit 220 may implement different levels of error correction. For example, in a single error correction (SEC) scheme, up to one bit of error may be located and detected. In a single error correction double error detection (SECDED) scheme, up to one bit of error may be corrected, but two errors may be detected (although the bits causing those errors are not individually located, so no correction can be made). In a double error correction (DEC) up to two bits of error may be located and corrected, in a triple error correction (TEC) up to three bits, and so forth. In some embodiments, the number of parity bits and the ECC implementation may be determined by the hardware and may be not be selectable.

The memory 200 may be operated in various modes based on a number of the DQ pads which are used. In some embodiments, the mode register 230 may include settings which determine how many DQ pads are used, even if there are more DQ pads available. The mode may determine both how many DQ pads the controller expects to send/receive data along, as well as the format and/or number of bits which the controller expects as part of a single access command. For example, the memory may have 16 physical DQ pads. In a 2p2 mode, four of those DQ pads are used, divided into two pseudo-channels of two DQ pads each. The mode may also determine a burst length at each DQ terminal as part of a DQ operation. The burst length represents a number of serial bits at each DQ terminal during an access operation. For example, in the 2p2 mode, each data terminal may receive a burst of 32 data bits plus some number of metadata bits (e.g., either 2 or 4 per DQ terminal).

The power supply terminals are supplied with power supply potentials VDD and VSS. The power supply potentials VDD and VSS are supplied to an internal voltage generator circuit 224. The internal voltage generator circuit 224 generates various internal potentials VARY, and the like based on the power supply potentials VDD and VSS supplied to the power supply terminals.

The power supply terminals are also supplied with power supply potentials VDDQ and VSSQ. The power supply potentials VDDQ and VSSQ are supplied to the input/output circuit 222. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 3:
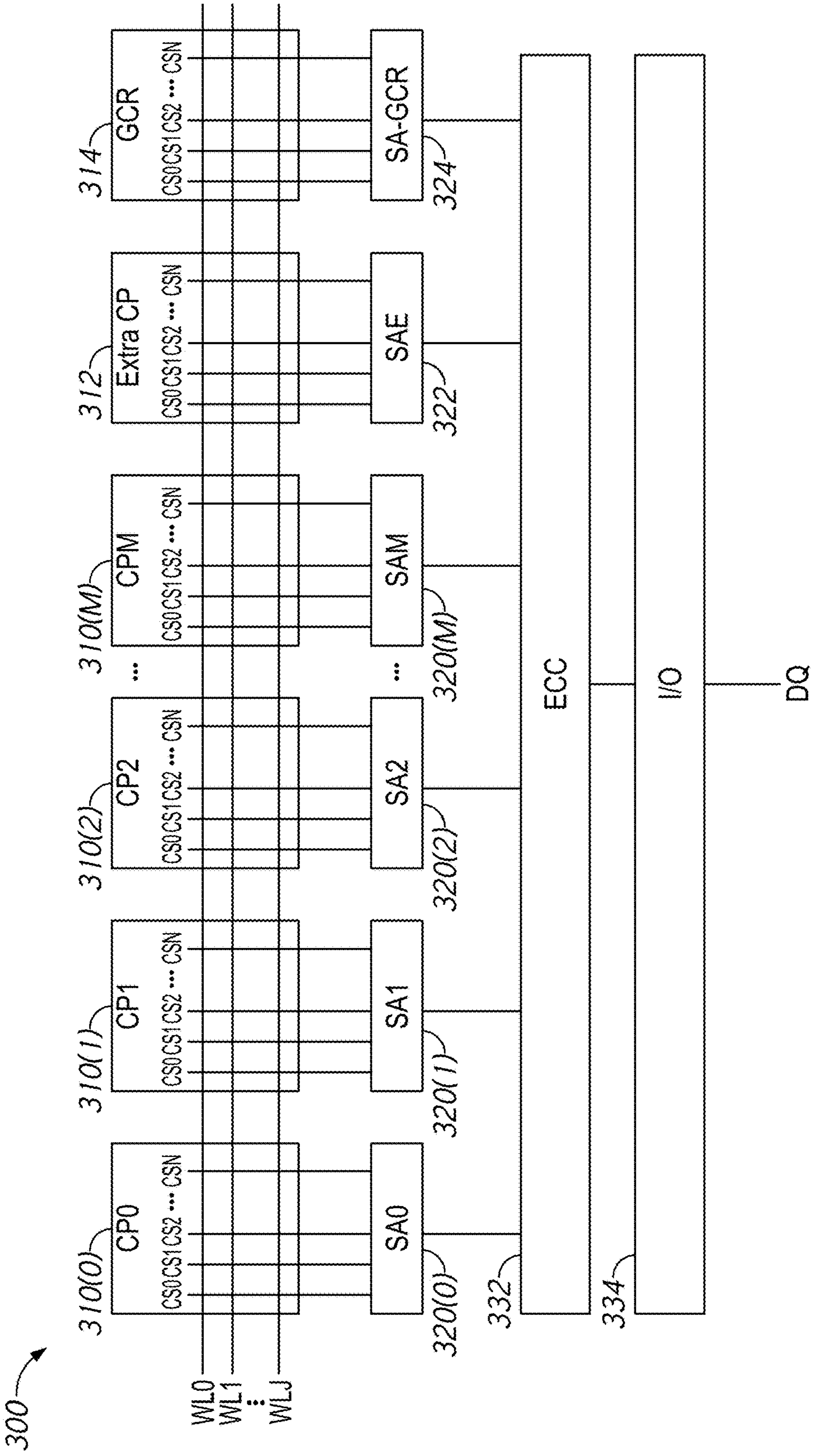
FIG. 3 is a block diagram of a memory device according to some embodiments of the present disclosure.

FIG. 3 is a block diagram of a memory device according to some embodiments of the present disclosure. The memory device 300 may, in some embodiments, represent a portion of the memory device 200 of FIG. 2. The view of FIG. 3 shows a portion of a memory array 310-314 and 320-324 which may be part of a memory bank (e.g., 218 of FIG. 2) along with selected circuits used in the data path such as the ECC circuit 332 (e.g., 220 of FIG. 2) and IO circuits 334 (e.g., 222 of FIG. 2). For clarity certain circuits and signals have been omitted from the view of FIG. 3.

The memory device 300 is organized into a number of column planes 310-314. Each of the column planes represents a portion of a memory bank. Each column plane 310-314 includes a number of memory cells at the intersection of word lines WL and bit lines. The bit lines may be grouped together into sets which are activated by a value of a column select (CS) signal. For the sake of clarity, only a single vertical line is used to represent the bit lines of each column select set, however, there may be multiple columns accessed by that value of CS. For example, each line may represent 8 bit lines, all accessed in common by a value of CS. As used herein, a 'value' of CS may refer to a decoded signal provided to sets of bit lines. So a first value may represent a first value of a multibit CS signal, or after decoding a signal line associated with that value being active. The word lines may be extend across multiple of the column planes 310-314.

The memory 300 includes a set of data column planes 310 as well as an extra column plane 312. The extra column plane 312 may be used to store additional information, such as error correction parity bits. In some embodiments, the memory 300 may also include an optional global column redundancy (GCR) column plane 314. In some embodiments, the GCR plane 314 may have fewer memory cells (e.g., fewer column select groups) than the data column planes 310. The GCR CP 314 includes a number of redundant columns which may be used as part of a repair operation. If a value of the CS signal is identified as including defective memory cells in one of the data column planes 310, then the memory may be remapped such that the data which would have been stored in that column plane for that value of CS is instead stored in the GCR CP 314.

In an example embodiment, the memory 310 may include 16 data column planes 310(0)-310(15). Each of those data column planes 310 includes 64 sets of column selects activated by a respective value of the column select signal, and each set of column select includes 8 bit lines. Accordingly, when a word line is opened responsive to a row address, if a column select signal is provided to each of the 16 column planes then 8 bits are accessed from each of the 16 column planes for a total of 128 bits. The column select signal may also be provided to the extra column plane 312, although that column select signal may be a different value than the one provided to the data column planes 310 for an additional 8 bits (e.g., which may generally be parity bits). If a repair has been performed, the GCR CP 314 may also be accessed by providing a value of the CS signal, and the values which are read out from the GCR 315 onto a GCR LIO may be used while ignoring the LIO of the column plane it is replacing. Accordingly, the maximum number of bits that can be retrieved as part of an access pass is 128 bits from the data column planes 310 (with 8 bits substituted from the GCR CP 314 if there has been a repair) along with 8 additional bits from the extra CP 312.

In the 2p2 architecture, fewer than 128 bits of data are accessed for a given access operation. Accordingly, only a portion of the data column planes 310 may be used to send/receive data. The column address may include a column plane select bit or bits which are used to determine which portion of the data column planes 310 are used. For example, the data column planes 310 may be split into two sets of eight data column planes each. A bit of the column address (e.g., an $11^{th}$ bit of the column address or CA10) may be used as the column plane select bit and may select which portion of the data column planes 310 is being used to store data as part of the current access operation.

As described in more detail herein, during a given access operation, data may be stored in the portion of the column planes selected by the column plane select bit, while parity may be stored in one or more non-selected column planes such as the extra column plane 312 and/or the data column planes 310 which were not selected by the column plane select bit. For example, the data may be stored in each column plane of the selected portion (e.g., 8 bits in each of 8 selected data column planes 310 for a total of 64 data bits).

The ECC circuit 332 generates a number of parity bits based on those 64 data bits. The number of parity bits may be based on a setting of the memory (e.g., in a mode register such as 230 of FIG. 2). Since each 64 bit data codeword is associated with some number of parity bits, there may not be room in the extra column plane 312 to store the parity for all of the data codewords. Accordingly, some data codewords may have their parity stored in the extra column plane 312, and some data codewords may have their parity stored in data column planes 310 which were not selected by the value of the column plane select bit associated with where the data is stored. For example, if the value of the column plane select bit selects either even or odd column planes, then data stored in even column planes may have its parity located in the extra column plane 312 and/or one or more of the odd column planes 310. Other ways of dividing up the column planes into portions may be used in other example embodiments.

In an example write operation, a controller (e.g., 150 of FIG. 1) provides data and to the memory device. The ECC circuit 332 generates parity bits which are written along with the data to the column planes 310-314 as part of a single access pass. In the example discussed herein, the IO circuit receives 64 bits of data in two bursts of 32 bits. The data is provided to the ECC circuit 332 which generates a set of P parity bits based on the data and metadata bits. The number P is based on a setting of the mode register. Based on the column address half of the data column planes 310 may be selected and the column decoder may provide a first value of the CS signal to the selected half of the column planes. The data may be written to the memory cells at the intersection of the active word line and the bit lines selected by the first value of CS in the selected half of the column planes 310. Depending on the column address and how many parity bits P were generated, the parity bits may either be written to the memory cells at the intersection of the word line and the bit lines selected by a CS signal (which may be the first CS value or a different value) in the extra column plane 312, and/or they may be written to the memory cells at the intersection of the word line and the bit lines selected by a second value of the CS signal in one of the data column planes in the non-selected portion In some embodiments, each data codeword (e.g., every 64 bits of data) may be associated with 8 parity bits (e.g., P=8). Accordingly, the parity for a given codeword may fit in a single column plane since up to 8 bits in a single column plane may be activated at once by a value of the CS signal. Based on mapping in the column decoder, the parity may be stored in a non-selected column plane (e.g., the extra column plane 312 or one of the data column planes 310 which was not selected by the column plane select value). The value of the CS signal used to store the parity may be different than the value of the CS signal used to store the data. Which of the non-selected column planes is used and what value of the CS signal is used may be determined by the column decoder based on the column address associated with the data.

In some embodiments, each data codeword may be associated with more than 8 bits of parity (e.g., P>8). To maintain single-pass access, the parity may be split into different portions and the different portions may be stored in more than one column plane. For example, if 12 bits of parity are used, then 4 bits each may be stored in three non-selected column planes (e.g., the extra column plane 312 and two of the non-selected data column planes 310 or three of the non-selected data column planes 310). In this manner, all 12 bits may be accessed along with the 64 data bits as part of a single access pass. While this example used a number of parity bits which was evenly divisible, in some embodiments, different column planes may receive different numbers of parity bits. For example, if 9 parity bits are used, then one column plane may be used to hold 8 parity bits, while a second column plane stores 1 parity bit.

The value of the CS signal used to store the parity may be different than the value of the CS signal used to store the data. In some embodiments, the value of the CS signal provided to the different column planes may be different from each other. For example, fi a mix of data and extra column planes is used, then the extra column plane may receive a different value than the data column planes. Which of the non-selected column planes is used and what value of the CS signal is used may be determined by the column decoder based on the column address associated with the data.

In some embodiments, since 8 bit lines are activated by each CS value, when there are fewer than 8 parity bits being stored in a column plane, it may be useful to protect the remaining bits associated with that CS value so they are not erroneously overwritten. In some embodiments, the memory may perform a read/modify/write cycle to read out all 8 bits, modify only the bits which are being changed (e.g., to overwrite them with parity), and then write all 8 bits back. In some embodiments, separate write enable signals may be used such that only some of the sense amplifiers associated with the CS value are modified at one time (rather than all 8). For example, only the sense amplifiers associated with the bitlines which will store the new parity bits may be modified. This may prevent the data on the bit lines coupled to the non-related sense amplifiers from being modified without requiring additional operations (e.g., a read/modify/write cycle). Other options for protecting the non-accessed bits associated with the CS signal may be used in other example embodiments.

In an example read operation, the data, and parity are retrieved as part of a single access pass. For example, the column decoder provides the first CS signal to the selected portion of the column planes 310 (based on the column plane select bit) and the data bits are read from memory cells at the intersection of the active word line and the bit lines activated by the first CS signal value in the selected portion of the column planes 310. The parity is retrieved either from the extra column plane 312 based on the first CS signal, and/or from one or more of the non-selected data column planes 310 based on a second CS signal value. The data and parity are provided to the ECC circuit 332 which performs error correction on the data and metadata based on the received bits. The level of correction performed by the ECC circuit 332 may be based on the number of parity bits (e.g., based on a setting in the mode register). For example, based on the setting the ECC circuit 332 may perform SECDED, DEC, TEC, and/or other types of error correction. The corrected data bits and are provided to the I/O circuit 334, where they provided to the DQ terminals.

Figure 4:
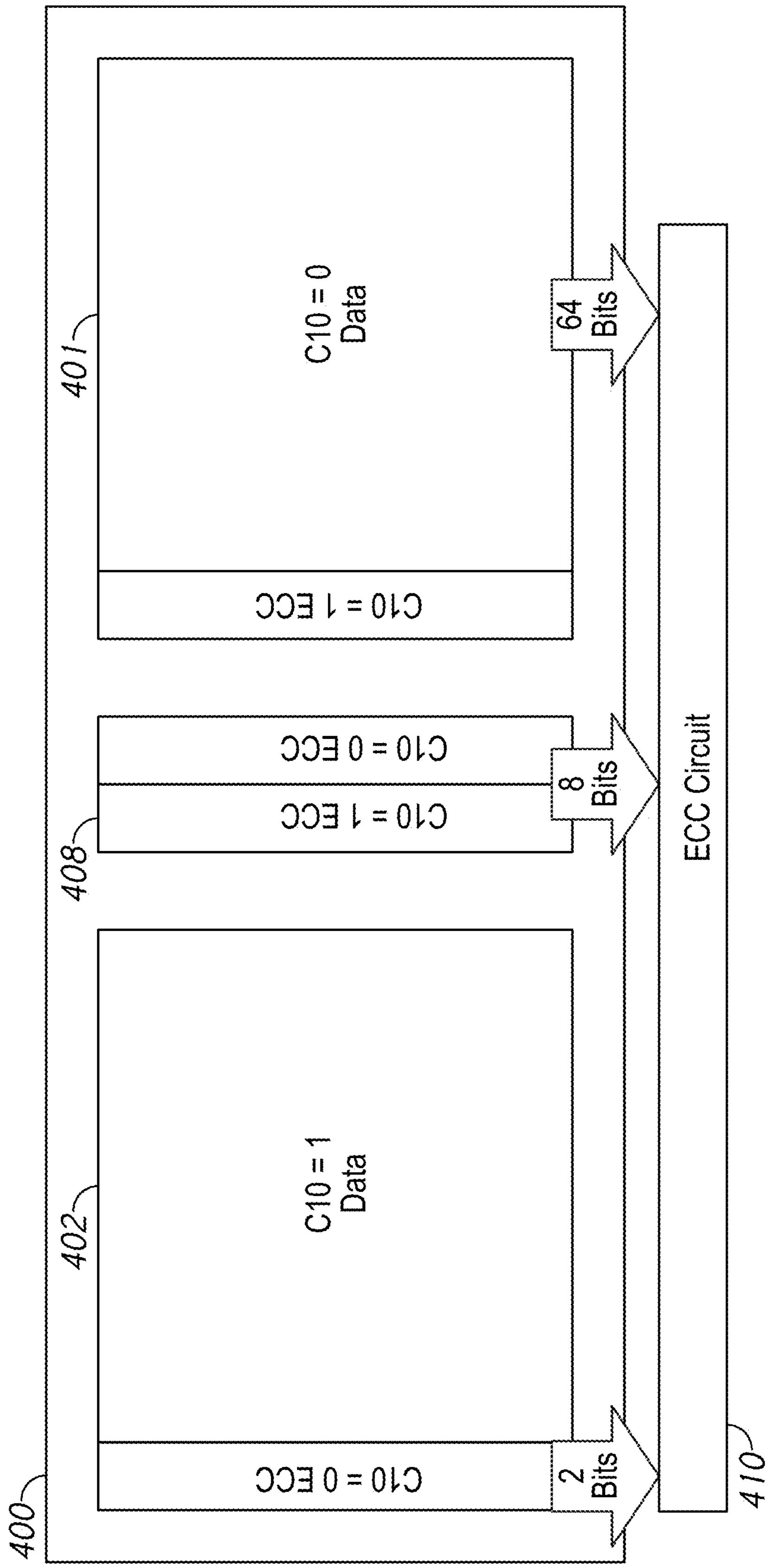
FIG. 4 is a block diagram of a memory array according to some examples of the present disclosure.

FIG. 4 is a block diagram of a memory array according to some examples of the present disclosure. The memory array 400 may, in some embodiments, represent the memory array in one or more of the memory devices 104-110 of FIG. 1, 200 of FIG. 2, and/or 300 of FIG. 3. The block diagram 400 represents how information may be distributed in a memory array 400, rather than the physical layout of the locations where that information is stored. The blocks of FIG. 4 may be subdivided to show what percentage of the array is set aside for different purposes and not the spatial relationships between where that information is stored.

The memory array 400 includes a second portion 402 and a first portion 401 of a plurality of data column planes (e.g., 310 of FIG. 3) and an extra column plane 408 (e.g., 312 of FIG. 3). The first portion 401 is selected for data storage when a column plane select bit (e.g., CA10) is in a low logical state (e.g., CA10=0) while the second portion 402 is selected for data storage when a column plane select bit is in a high logical state (e.g., CA10=1). Some of the space in the data column planes 401 and 402 is set aside for storing parity bits associated with data which is stored in the other portion. For example, the first portion 401 may include parity bits (CA10=1 ECC bits) associated with data stored in the second portion 402, and the second portion 402 may include parity bits (CA10=0 ECC bits) associated with data stored in the first portion 401.

The space in the portions 401 and 402 which are used for parity may represent different column select values which are reserved for parity in one or more of the column planes. For example, if there are CS value 0-M for each column plane, then CS values 0-(N−1) may be used for data while CS values N-M may be used to store the parity. In some embodiments, some column planes may have space set aside for parity while others may not.

Similar to the portions 401 and 402, the extra column plane 408 is divided into a first section which includes parity bits associated with data stored in the first portion and a second section which includes parity bits associated with data stored in the second portion. The division between the sections of the extra column planes may be based on the CS signal. For example a first half of the CS values in the extra column plane 408 may be set aside for CA10=1 and a second half of the CS values in the extra column plane 408 may be set aside for CA10=0.

In an example read operation, 10 bits of parity may be used (e.g., based on a setting of the memory device). Responsive to a row address a word line is opened, and the column decoder may provide CS signals and read commands to the column planes. In this example, a read is performed where the column plane select bit is a logical high. The column decoder provides a first CS value to each of the 8 column planes in the first portion 401, and reads out 64 bits of data. The column decoder also provides a second CS value to the extra column plane 408 and reads out 8 bits. The second CS value is chosen so that it's in a section of the extra column plane which is associated with CA10=0. The column decoder also provides a third CS value to a selected column plane in the second portion 402, and reads out 2 parity bits from that column plane. An ECC circuit 410 (e.g., 220 of FIGS. 2 and/or 332 of FIG. 3) receives the 64 data bits and the 10 parity bits and performs error correction based on the data and parity.

Figure 5:
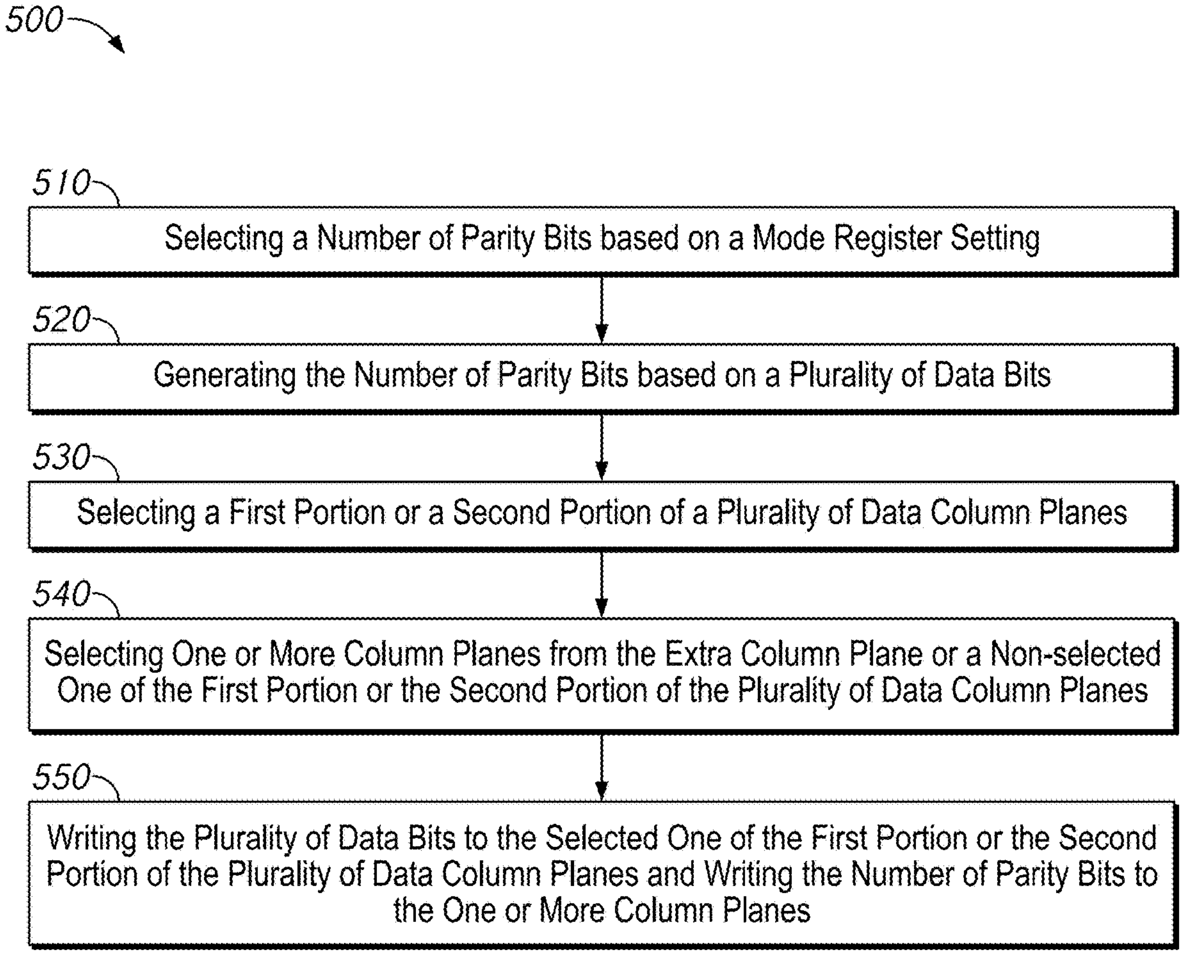
FIG. 5 is a flow chart of a method of writing data and parity to a memory array according to some examples of the present disclosure.

FIG. 5 is a flow chart of a method of writing data and parity to a memory array according to some examples of the present disclosure. The method 500 may, in some embodiments, be implemented by one or more of the apparatuses and system described herein. For example, the method may be implemented by a memory device such as 104-110 of FIG. 1, 200 of FIG. 2, and/or 300 of FIG. 3 and/or in a memory array such as 400 of FIG. 4.

The method 500 may generally begin with box 510 which describes selecting a number of parity bits based on a mode register setting. The mode register (e.g., 230 of FIG. 2) includes a setting which may indicate a number of parity bits to be used by the memory device.

Box 510 may generally be followed by box 520 which describes generating the number of parity bits based on a plurality of data bits. The method 500 may include receiving the plurality of data bits from a controller (e.g., 150 of FIG. 1) as part of a write operation. An ECC circuit (e.g., 220 of FIG. 2, 332 of FIG. 3, and/or 410 of FIG. 4) generates the parity bits. The logic of the ECC circuit and the number of active outputs for parity bits may be selected based on the mode register setting.

The box 510 may generally be followed by boxes 530 and 540. Box 530 describes selecting a first portion or a second portion of a plurality of data column planes. The selection may be based on a column plane select bit, which may be part of the column address (e.g., CA10). The first portion and the second portion (e.g., 401 and 402 of FIG. 4) may represent a first half and a second half of the data column planes. The selecting may be done by a column decoder (e.g., 210 of FIG. 2).

Box 540 describes selecting one or more column planes from the extra column plane or a non-selected one of the first portion or the second portion of the plurality of data column planes. The column decoder may include mapping which determines which and how many of the column planes are selected as the one or more column planes. For example the mapping may be based in part on the setting of the number of parity bits in the mode register and the column address.

In some embodiments, a single column plane may be selected. For example, if the number of parity bits is equal to or less than the number of bits which are accessed in a single column plane by a single CS signal (e.g., 8 or fewer bits) then a single column plane may be used. The single column plane may either be the extra column plane or one of the non-selected data column planes (e.g., the data column planes not selected by the value of CA10). Which single column plane is used for a given set of data may depend on the column address.

In some embodiments, multiple column planes may be selected for the parity. For example, if the number of parity bits is greater than the number of bits which are accessed in a single column plane a CS signal (e.g., more than 8 bits) than multiple column planes may be used. The two or more column planes may include the extra column plane as well as one or more of the non-selected data column planes, or may include two or more of the data column planes. Which column planes are selected may be based on the column address.

Boxes 530 and 540 may generally be followed by box 550, which describes writing the plurality of data bits to the selected one of the first portion or the second portion of the plurality of data column planes and writing the number of parity bits to the one or more column planes. Both writing steps may be performed as part of a single access pass. The writing may include providing a first column select signal value to the selected one of the first portion or the second portion of the plurality of data column planes and providing a second column select signal value to the one or more column planes.

In some embodiments if there are two or more column planes used to store the parity, the method 500 may include providing a second column select signal value to one of them and a third column select signal value to the other. In some embodiments the second column select signal value may be provided to multiple of the column planes used to store the parity. In some embodiments where there are two column planes used to store the parity, a first column plane may receive a first portion of the plurality of parity bits and a second column plane may receive a second portion of the plurality of parity bits. The portions may be of different sizes.

In some embodiments, the method 500 may include reading the data which was written in boxes 510-550. For example, the method 500 may include reading the plurality of data bits from the selected one of the first portion or the second portion of the plurality of data column planes and reading the number of parity bits from the one or more column planes and performing error correction on the plurality of data bits based on the number of parity bits at a level based on the mode register setting. The method may include performing single error correction double error detection (SECDED), double error correction (DEC), or triple error correction (TEC) on the plurality of data bits read from the selected one of the first portion or the second portion of the plurality of data column planes based on the number of parity bits.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:

a memory device, comprising:

a memory array comprising:

a plurality of data column planes including a first portion of the plurality of data column planes and a second portion of the plurality of data column planes; and an extra column plane;

an error correction code (ECC) circuit configured to receive a plurality of data bits and generate a plurality of parity bits based on the plurality of data bits; and a column decoder, wherein responsive to a write command the column decoder is configured to provide a first column select signal value and write the plurality of data bits to a selected one of the first or the second portion of the plurality of data column planes and configured to provide a second column select signal value and write the plurality of parity bits to the extra column plane, a non-selected one of the first or the second portion of the plurality of data column planes, or combinations thereof as part of a single access pass.

2. The apparatus of claim 1, wherein the column decoder is further configured to provide the second column select signal value to the extra column plane and a third column select signal to a selected column plane in the non-selected one of the first portion or the second portion of the plurality of data column planes and write a first portion of the plurality of parity bits to the extra column plane and a second portion of the plurality of parity bits to the selected column plane.

3. The apparatus of claim 1, wherein the column decoder is configured to select the selected one of the first portion or the second portion of the plurality of data column planes based on a column select bit of the column address.

4. The apparatus of claim 1, wherein responsive to a read command the column decoder is configured to provide the first column select signal value and read the plurality of data bits from the selected one of the first or the second portion of the plurality of data column planes and configured to provide the second column select signal and read the plurality of parity bits from the extra column plane, the non-selected one of the first or the second portion of the plurality of data column planes, or combinations thereof as part of a single access pass.

5. The apparatus of claim 4, wherein the ECC is configured to receive the plurality of data bits and the plurality of parity bits responsive to the read command and perform error correction on the plurality of data bits based on the plurality of parity bits.

6. The apparatus of claim 1, further comprising a mode register configured to select a number of the parity bits.

7. The apparatus of claim 6, wherein the ECC circuit is configured to implement single error correction double error detection (SECDED), double error correction (DEC), or triple error correction (TEC) based on the number of parity bits.

8. An apparatus comprising:
- a memory device, comprising:
  - a memory array comprising:
    - a plurality of data column planes including a first portion of the plurality of data column planes and a second portion of the plurality of data column planes; and
    - an extra column plane;
  - an error correction code (ECC) circuit configured to receive a plurality of data bits and generate a plurality of parity bits based on the plurality of data bits; and
  - a column decoder configured to write the plurality of data bits in to a selected one of the first portion or the second portion of the plurality of data column planes and configured to write the plurality of parity bits in at least two column planes selected from the extra column plane and a non-selected one of the first portion or the second portion of the plurality of data column planes, wherein the column decoder is configured to write the plurality of data bits and the plurality of parity bits as part of a single access pass.

9. The apparatus of claim 8, further comprising a mode register configured to select a number of the plurality of parity bits.

10. The apparatus of claim 8, wherein the column decoder is configured to provide a first column select signal value to a first one of the at least two column planes and a second column select signal value to a second one of the at least two column planes.

11. The apparatus of claim 10, wherein the column decoder is further configured to provide a third column select signal value to the selected one of the first portion or the second portion of the plurality of data column planes.

12. The apparatus of claim 8, wherein the column decoder is configured to write a first portion of the plurality of parity bits to a first of the at least two column planes and a second portion of the plurality of parity bits to a second of the at least two column planes wherein the first portion and the second portion of the plurality of parity bits are different in size.

13. A method comprising:
- selecting a number of parity bits based on a mode register setting of a memory device;
- generating the number of parity bits based on a plurality of data bits;
- selecting a first portion or a second portion of a plurality of data column planes of a memory array of the memory device;
- selecting one or more column planes from an extra column plane or a non-selected one of the first portion or the second portion of the plurality of data column planes; and
- writing the plurality of data bits to the selected one of the first portion or the second portion of the plurality of data column planes and writing the number of parity bits to the one or more column planes as part of a single access pass.

14. The method of claim 13, further comprising writing the number of parity bits to at least two of the one or more column planes.

15. The method of claim 14, further comprising writing a first portion of the number of parity bits to a first one of the at least two of the one or more column planes and writing a second portion of the number of parity bits to a second one of the at least two of the one or more column planes, wherein the first portion and the second portion are different in size.

16. The method of claim 14, wherein a first one of the at least two of the one or more column planes is the extra column plane and wherein a second one of the at least two of the one or more column planes is a column plane in the non-selected one of the first portion or the second portion of the plurality of data column planes.

17. The method of claim 13, further comprising:
- providing a first column select signal value to the selected one of the first portion or the second portion of the plurality of column planes; and
  - providing a second column select signal value to the selected one or more column planes.

18. The method of claim 13, further comprising:
- reading the plurality of data bits from the selected one of the first portion or the second portion of the plurality of data column planes and reading the number of parity bits from the one or more column planes; and
- performing error correction on the plurality of data bits based on the number of parity bits at a level based on the mode register setting.

19. The method of claim 18, further comprising performing single error correction double error detection (SECDED), double error correction (DEC), or triple error correction (TEC) on the plurality of data bits read from the selected one of the first portion or the second portion of the plurality of data column planes based on the number of parity bits.

* * * * *